(12) United States Patent
Izumi

(10) Patent No.: US 8,929,144 B2
(45) Date of Patent: Jan. 6, 2015

(54) NONVOLATILE SEMICONDUCTOR MEMORY DEVICE

(71) Applicant: Kabushiki Kaisha Toshiba, Tokyo (JP)

(72) Inventor: Tatsuo Izumi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 13/755,419

(22) Filed: Jan. 31, 2013

(65) Prior Publication Data

US 2013/0201762 A1 Aug. 8, 2013

(30) Foreign Application Priority Data

Feb. 8, 2012 (JP) .................................. 2012-025541

(51) Int. Cl.
*G11C 16/04* (2006.01)

(52) U.S. Cl.
CPC ........ *G11C 16/0408* (2013.01); *G11C 16/0483* (2013.01)
USPC ............ 365/185.17; 365/185.18; 365/185.22; 365/185.28

(58) Field of Classification Search
CPC .................................................. G11C 16/0483
USPC .............. 365/185.17, 185.18, 185.22, 185.28
See application file for complete search history.

(56) References Cited

U.S. PATENT DOCUMENTS

| 2004/0105308 | A1 | 6/2004 | Matsunaga |
| 2007/0258286 | A1* | 11/2007 | Higashitani ............. 365/185.14 |
| 2007/0279986 | A1 | 12/2007 | Yaegashi |
| 2008/0008006 | A1* | 1/2008 | Goda et al. .............. 365/185.18 |
| 2008/0266951 | A1 | 10/2008 | Hwang |

FOREIGN PATENT DOCUMENTS

| JP | 2008-269774 | 11/2008 |
| JP | 2009-295259 | 12/2009 |

* cited by examiner

*Primary Examiner* — Hoai V Ho
(74) *Attorney, Agent, or Firm* — Patterson & Sheridan, LLP

(57) ABSTRACT

According to one embodiment, a control circuit of a memory cell array is configured to write data to a memory cell array by applying a first write pass voltage, which is lower than the program voltage, to a first group of nonselective word lines adjacent to a selective word line. The control circuit is further configured to apply a second write pass voltage, which is higher than the first write pass voltage, to a second group of second nonselective word lines, the second group not including the word lines of the first group.

20 Claims, 11 Drawing Sheets

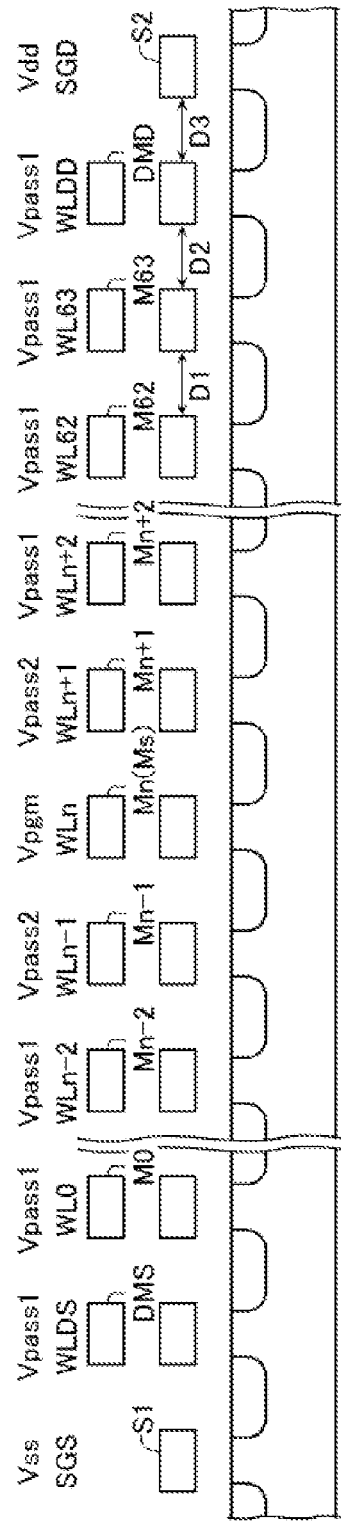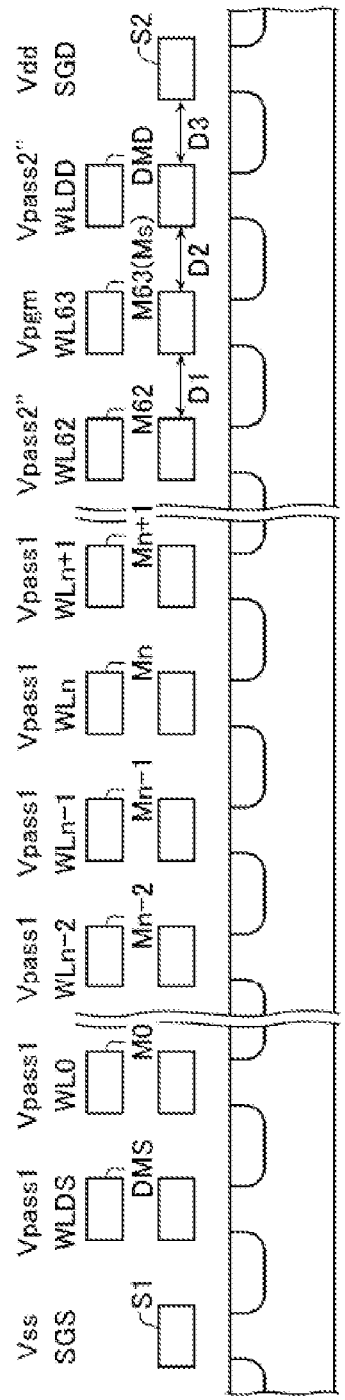

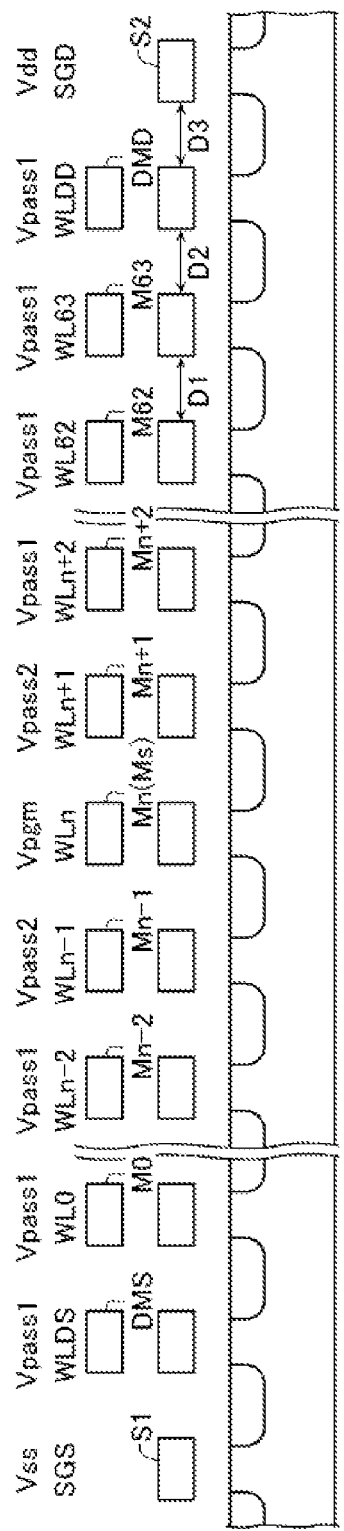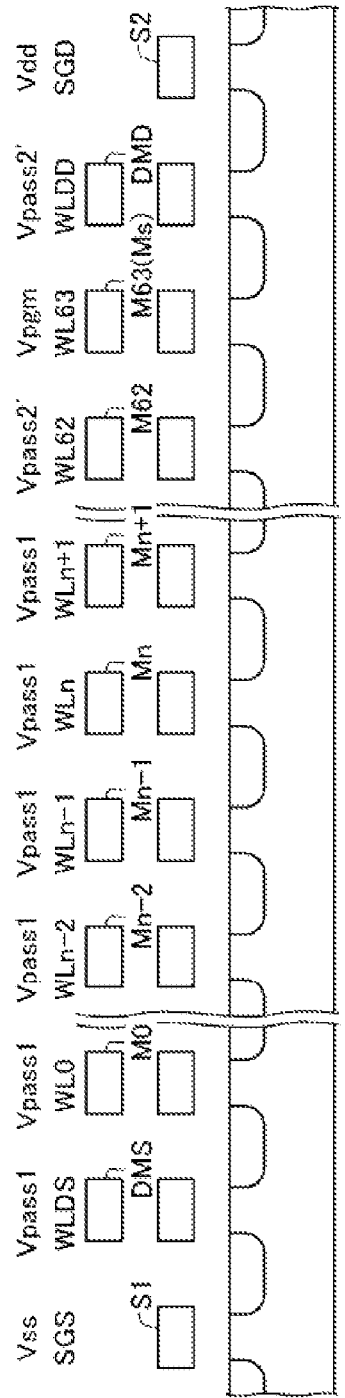
Fig. 8A
Fig. 8B

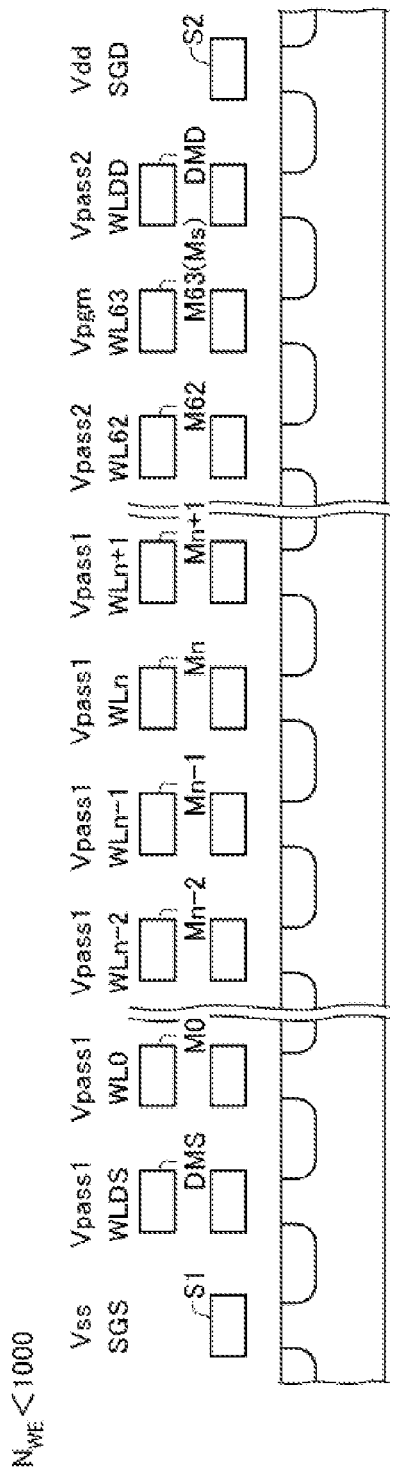
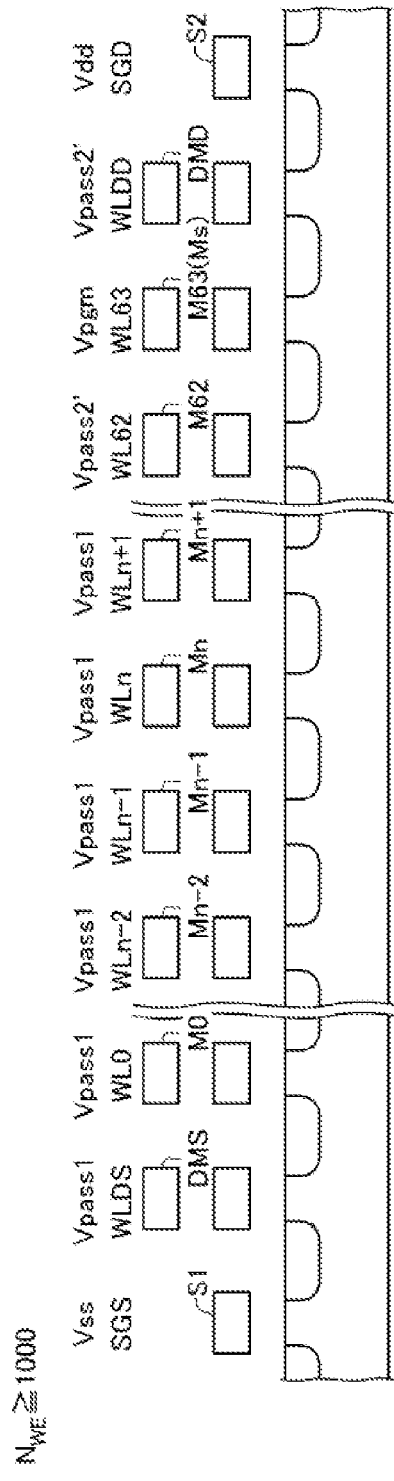

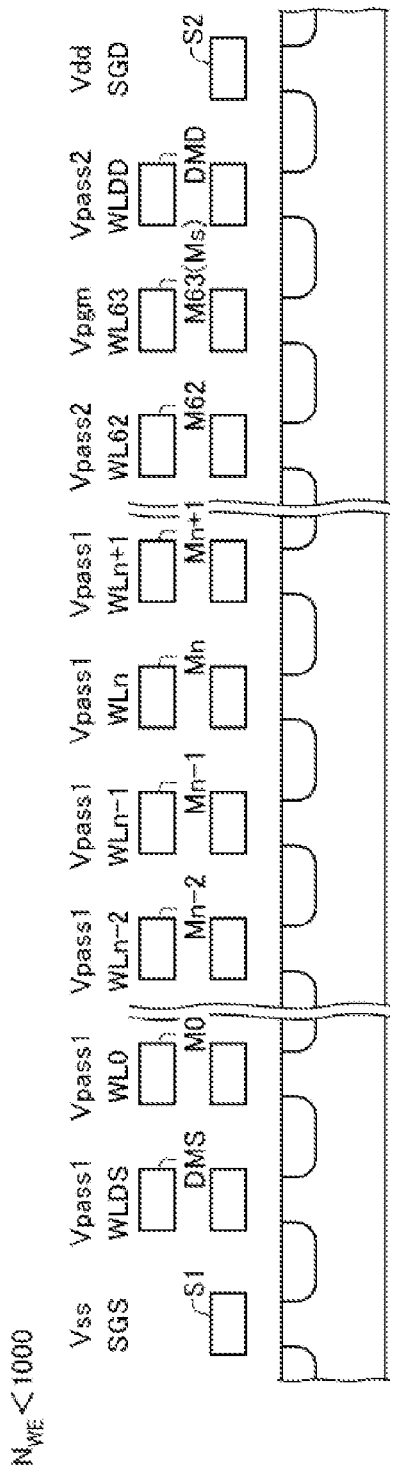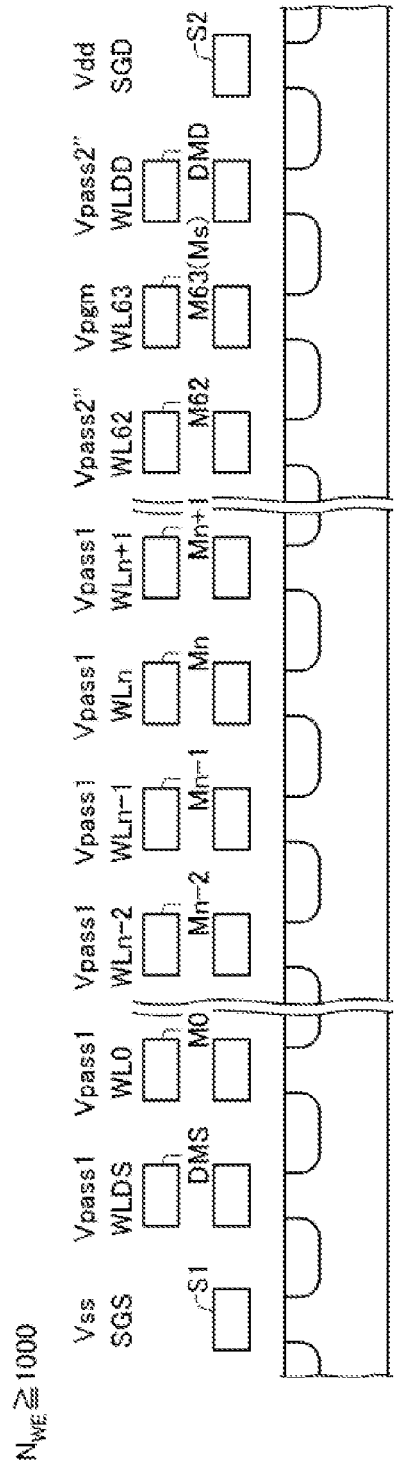

NONVOLATILE SEMICONDUCTOR MEMORY DEVICE

CROSS-REFERENCE TO RELATED APPLICATION

This application is based upon and claims the benefit of priority from Japanese Patent Application No. 2012-025541, filed Feb. 8, 2012; the entire contents of which are incorporated herein by reference.

FIELD

Embodiments described herein relate generally to a nonvolatile semiconductor memory device.

BACKGROUND

Recently, as NAND-type flash memories have become miniaturized, the reliability at a time of a write operation of data has been a problem. The NAND-type flash memory has memory cells connected in series, a source line connected to one end of the memory cells connected in series, and bit lines connected to the other end.

When data are written in this NAND-type flash memory, the applied voltage to the memory cells is changed in the following sequence. First, a write bypass voltage Vpass (for example, about 8 to 10 V), which is a level at which a threshold voltage is not changed, is applied to a control gate of memory cells that are not going to be written (i.e., nonselective memory cells), and the nonselective memory cells are set to an on state. Next, a program voltage Vpgm (for example, a voltage of 20 V or higher) is applied to a control gate of memory cells that are going to be written (i.e., selective memory cells), and electric charges are stored in a floating gate of selective memory cells. Therefore, the threshold voltage of the selective memory cells is raised ("0" data is written into the selective memory cells). The above describes the data write sequence.

DESCRIPTION OF THE DRAWINGS

FIG. 7A is an illustrative diagram showing a write operation according to a second embodiment.

FIG. 7B is an illustrative diagram showing the write operation according to the second embodiment.

FIG. 8A is an illustrative diagram showing a write operation according to a third embodiment.

FIG. 8B is an illustrative diagram showing the write operation according to the third embodiment.

FIGS. 9A and 9B are illustrative diagrams showing a write operation according to a fourth embodiment.

FIGS. 10A and 10B are illustrative diagrams showing the write operation according to the fourth embodiment.

DETAILED DESCRIPTION

Embodiments described in this specification provide a nonvolatile semiconductor memory device in which the occurrence of a write error at a time of a write operation is suppressed, thereby improving reliability.

In general, according to one embodiment, the nonvolatile semiconductor memory devices of the following embodiments include a memory cell array in which a memory string comprising several memory cells connected in series is arranged. Word lines are connected to the control gates of each of these memory cells. A control circuit controls a data write into the memory cells.

When a write operation into the memory cells is implemented, the control circuit applies a program voltage to a selective (selected) word line and applies a first write pass voltage lower than the program voltage to a first group of nonselective (non-selected) word lines which are adjacent to the selective word line. A second write pass voltage higher than the first write pass voltage is applied to a second group of nonselective word lines not including the first group of nonselective word lines. When the first nonselective word lines are word lines at the ends of memory string, the first write pass voltage is set to a value greater than when the first nonselective word lines are word lines other than the word lines at the ends of the memory string. In this context, the "ends of the memory string" means either a first or a last memory cell intended for storing data in the series of connected memory cells forming the memory string. Dummy memory cells inserted before the first memory cell intended for storing data or after the last memory cell intended for storing data may be included in the memory string without altering this definition.

Next, embodiments of the embodiment will be explained with reference to the drawings.

First Embodiment

Figure 1:
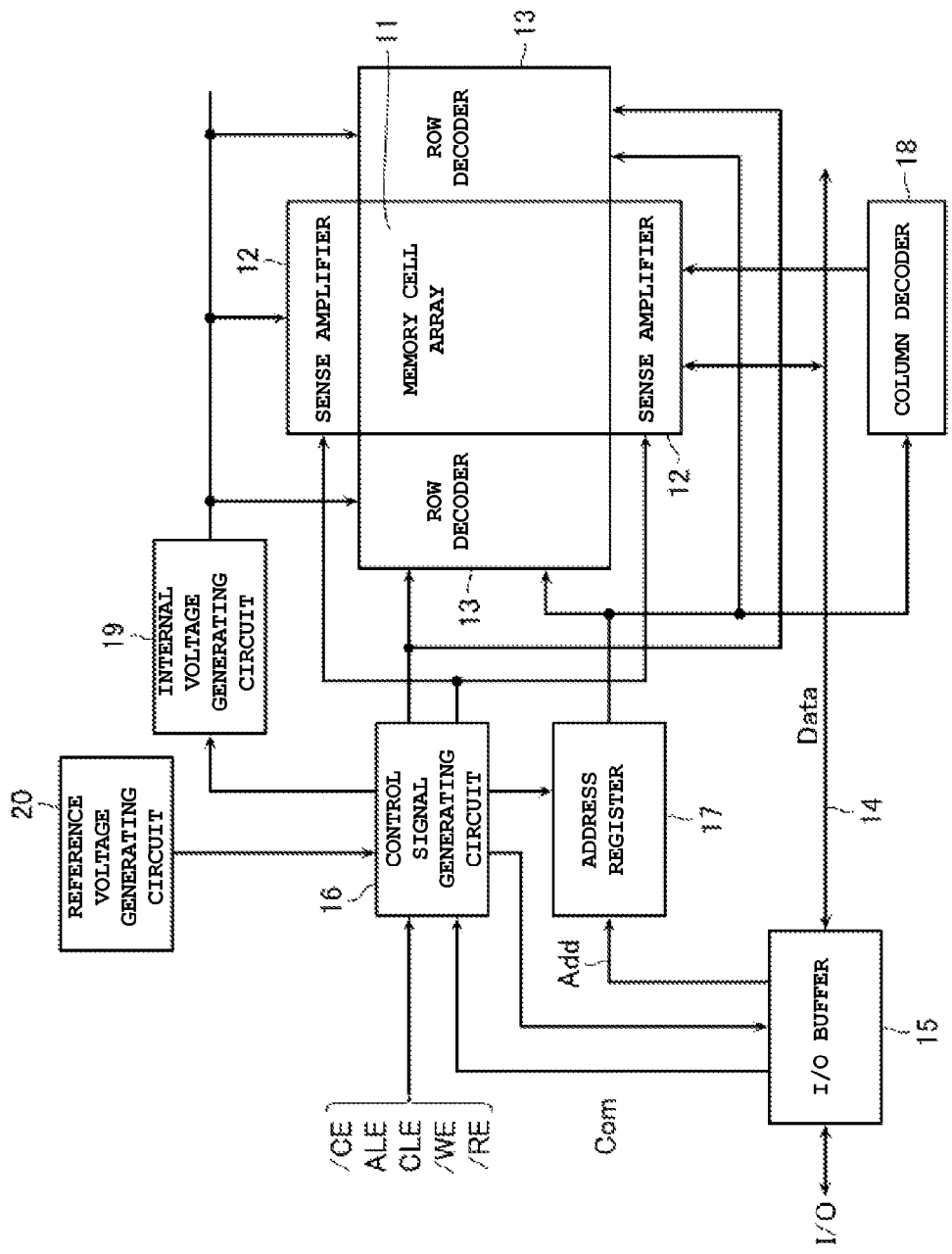
FIG. 1 is a block diagram showing the constitution of a nonvolatile semiconductor memory device (NAND-type flash memory) according to a first embodiment.
Figure 2:
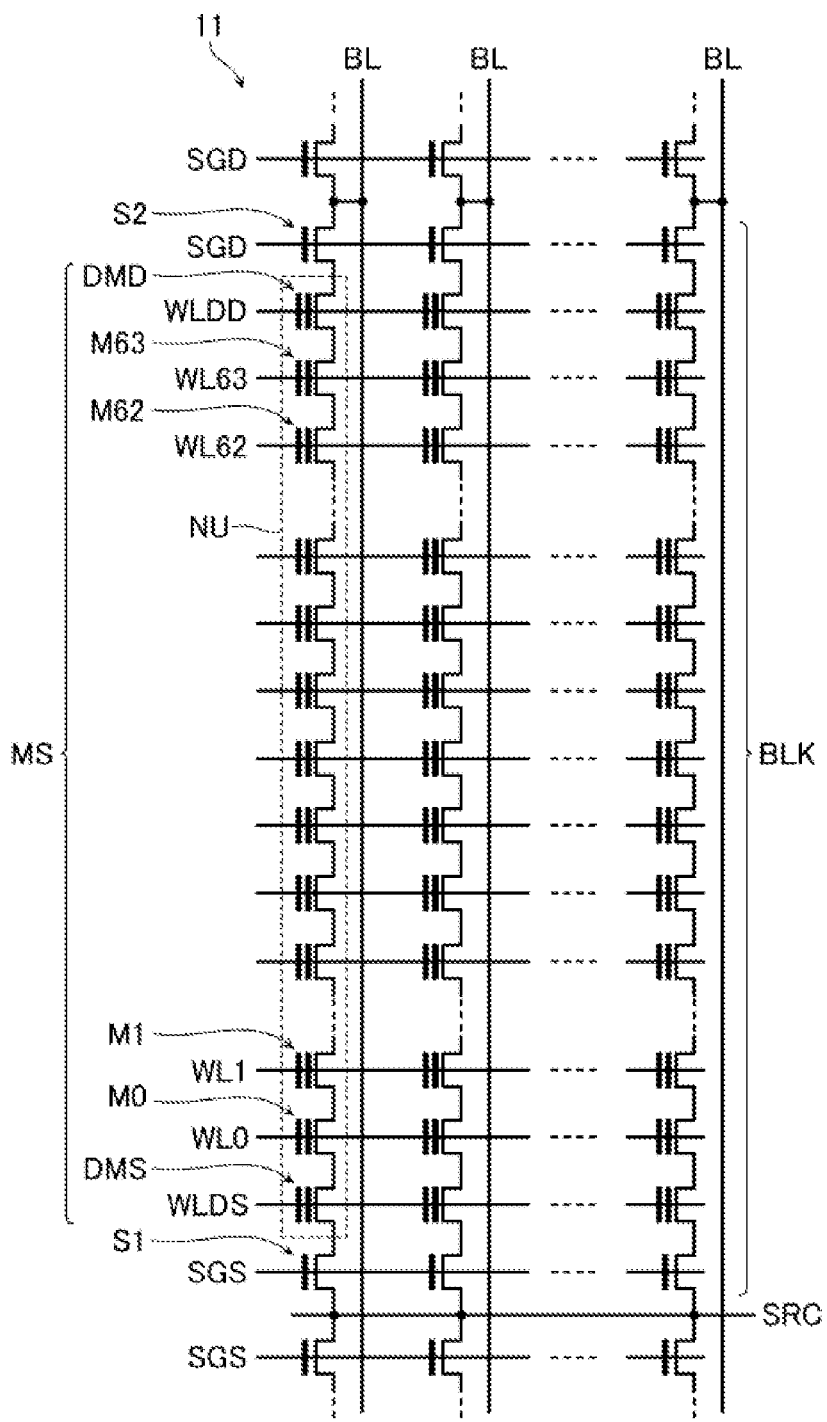
FIG. 2 is a circuit diagram depicting a memory cell array of the first embodiment.

First, a constitution of a nonvolatile semiconductor memory device of a first embodiment will be explained with reference to FIG. 1 and FIG. 2. FIG. 1 is a block diagram showing the constitution of the nonvolatile semiconductor memory device (NAND-type flash memory) of the first embodiment. FIG. 2 is a circuit diagram showing the constitution of a memory cell array 11, which will be mentioned later. The nonvolatile semiconductor memory device of the first embodiment, as shown in FIG. 1, has the memory cell array 11, sense amplifiers 12, row decoders 13, a data line 14, an I/O buffer 15, a control signal generating circuit 16, an address register 17, a column decoder 18, an internal voltage generating circuit 19, and a reference voltage generating circuit 20.

The memory cell array 11, as shown in FIG. 2, is constituted by arranging NAND cell units NU in a matrix form. Each NAND cell unit NU, for example, includes 64 pieces of rewritable nonvolatile memory cells M0 to M63 connected in series and a memory string MS which includes dummy memory cells DMS and DMD, which are connected to respective ends of the memory string. The dummy memory cells DMS and DMD have a constitution similar to that of the memory cells M0 to M63 and are included in the definition of memory cells in this specification; however, they are not used for data storage. In other words, this embodiment adopts a constitution in which the first and last memory cells in the memory string are the dummy memory cells DMS and DMD, which are not used for data storage (but, as noted above, the ends of the memory string are the first and last memory cell intended for data storage). In the following, in case the memory cell M0 or M63 is a selective memory cell at a time of a write operation, the dummy memory cells DMS and DMD adjacent to the memory cell are sometimes called "first nonselective memory cells."

In addition, selective transistors S1 and S2 for connecting a common source line SRC and bit lines BL are connected to both ends of the memory string MS. These memory cells M0 to M63, dummy memory cells DMS and DMD, and selective transistors S1 and S2 together form a NAND cell unit NU.

A control gate of each of the memory cells M0 to M63 in the NAND cell unit NU, as shown in FIG. 2, is connected to different word lines WL0 to WL63. The control gate of the dummy cell memories DMS and DMD is connected to dummy word lines WLDS and WLDD, respectively. In addition, gates of the transistors S1 and S2 are respectively connected to selective gate lines SGS and SGD.

A set of the NAND cell units NU, which share the same word lines WL, constitutes a block BLK as a data erase unit. Several blocks BLK are arranged in the longitudinal direction of the bit lines BL, though they are not shown in FIG. 2. Each bit line BL is connected to the sense amplifier 12. The memory cells M commonly connected to the same word line WL constitute one page or several pages.

Next, the constitution of the nonvolatile semiconductor memory device other than the memory cell array 11 will be explained with reference to FIG. 1. The sense amplifier 12, as shown in FIG. 1, is connected to the bit lines BL and also serves as a data latch that reads out data at a page unit and holds write data of one page. In other words, a column selective gate circuit for data cache and column selective, which temporarily holds input and output data, is attached to the sense amplifier 12.

The row decoder 13, as shown in FIG. 1, selectively drives the word lines WL and the selective gate lines SGD and SGS according to a row address. The row decoder 13 includes a word line driver and a selective gate line driver. In addition, the column decoder 18 for controlling a column selective gate circuit in the sense amplifier is installed in the sense amplifier 12. The row decoder 13, column decoder 18, and sense amplifier 12 constitute a readout/write circuit for data readout and write of the memory cell array 11.

Between the external input/output port I/O and the sense amplifier 12, data are transferred by the input/output buffer 15 and the data line 14. In other words, page data read out to the sense amplifier 12 are output to the data line 14 and output to the input/output port I/O via the input/output buffer 15. In addition, write data, which are supplied from the input/output port I/O, are loaded into the sense amplifier 12 via the input/output buffer 15.

Address data Add, which are supplied from the input/output port I/O, are supplied to the row decoder 13 and the column decoder 18 via the address register 17. Command data Com, which are supplied from the input/output port I/O, are decoded and set in the control signal generating circuit 16.

Each external control signal of chip enable signal /CE, address latch enable signal ALE, command latch enable signal CLE, write enable signal /WE, and readout enable signal /RE is supplied to the control signal generating circuit 16.

Based on the command Com and an external control signal, the control signal generating circuit 16 controls the internal voltage generating circuit 19 in addition to an operation control of the whole memory operation, reads out data, and generates various kinds of internal voltages required for write and erase. In addition, the control signal generating circuit 16 is applied with a reference voltage from the referenced voltage generating circuit 20. The control signal generating circuit 16 carries out a write operation on the selective memory cells M at the source line SL and controls a read operation.

Next, sectional structures of the memory cells M, dummy cells DMS and DMD, and selective transistors S1 and S2 will be explained with reference to FIG. 3 and FIG. 4.

Figure 3:
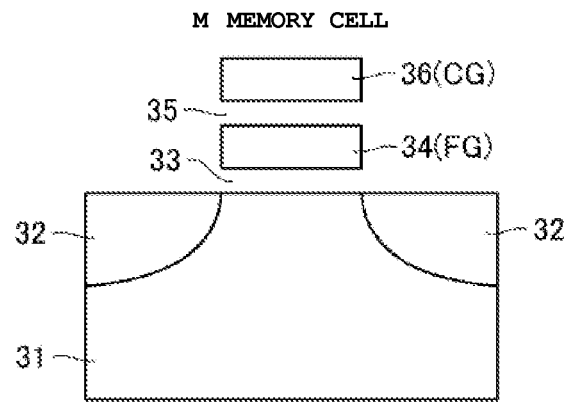
FIG. 3 is a schematic diagram depicting a memory cell and dummy cells of the first embodiment.

The memory cells M and the dummy cells DMS and DMD, as shown in FIG. 3, have n-type diffusion layers 32 functioning as a source and a drain of MOSFET on a substrate 31. In addition, the memory cells M and the dummy cells DMS and DMD have a floating gate (FG) 34 via a gate insulating film 33 on the substrate 31 and a control gate (CG) 36 via an insulating film 35 on the floating gate 34.

Figure 4:
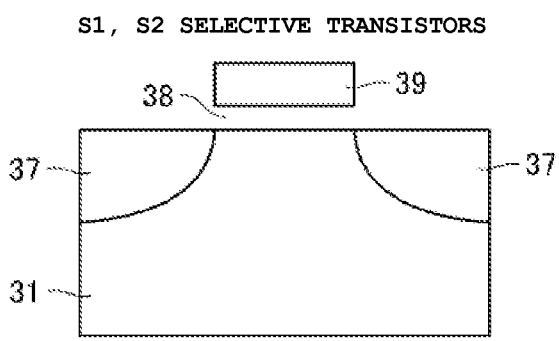
FIG. 4 is a schematic diagram showing depicting selective transistors of the first embodiment.

The selective transistors S1 and S2, as shown in FIG. 4, have the substrate 31 and n-type diffusion layers 37 as a source and a drain formed on the substrate 31. In addition, the selective transistors S1 and S2 have a control gate 39 via a gate insulating film 38 on the substrate 31.

Figure 5:
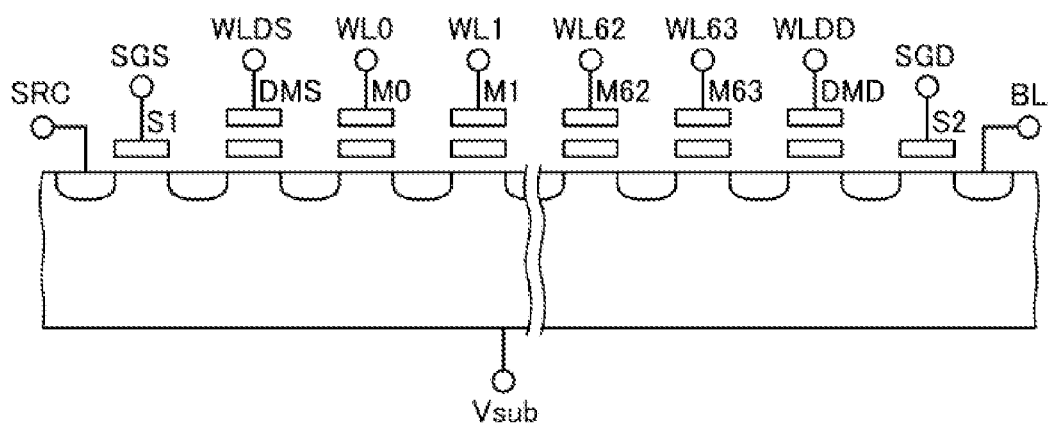
FIG. 5 is a schematic diagram depicting a sectional structure of an NAND cell unit of the first embodiment.

FIG. 5 shows a cross section of one NAND cell unit NU in the memory cell array 11. One NAND cell unit NU is constituted by connecting 64 pieces of memory cells M0 to M63 and the dummy cells DMS and DMD with the constitution shown in FIG. 3 in series. At the other ends of the dummy cells DMS and DMD, the selective transistors S1 and S2 with the constitution shown in FIG. 4 are installed.

(Write Operation)

Figure 6A:
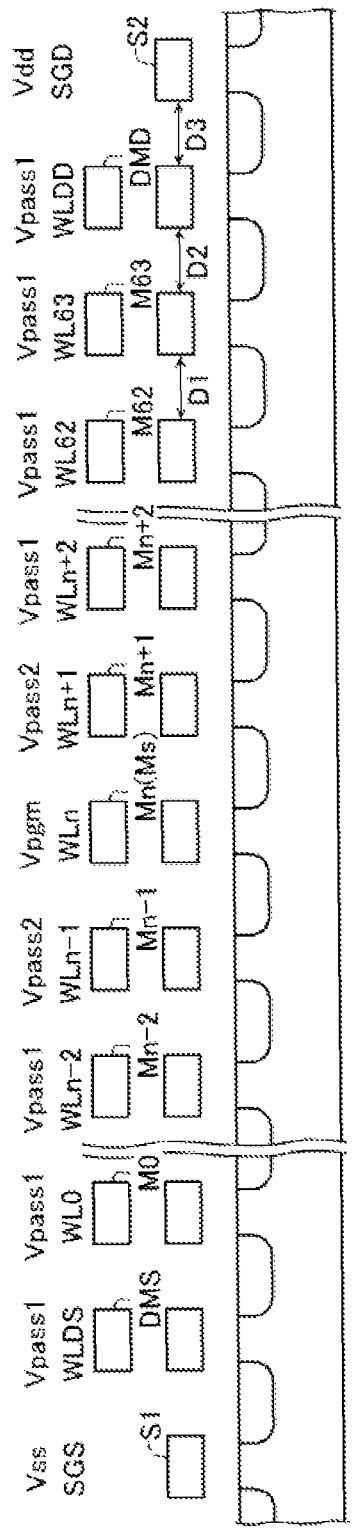
FIG. 6A is an illustrative diagram showing a write operation according to the first embodiment.

Next, a write operation in the nonvolatile semiconductor memory device of the first embodiment will be explained with reference to FIG. 6A and FIG. 6B.

First, the case where memory cells Mn other than the memories M0 and M63 are selected as selective memories Ms (nonselective word lines (first nonselective word lines) adjacent to the selective word lines are word lines other than the word lines at the ends of the memory string MS) will be explained with reference to FIG. 6A. In this case, a write voltage Vpgm (for example, 20 V or more) is applied to the control gate (selective word lines) of the selected memory cells Mn (Ms).

In addition, a write pass voltage Vpass2 with a size for only conducting the memory cells Mn−1 and Mn+1, which is insufficient for generating a write operation, is applied to the control gate (first nonselective word lines) of the nonselective memory cells Mn−1 and Mn+1 (first nonselective memory cells) adjacent to the selective memory cells Mn.

Next, a write pass voltage Vpass1 with a size for only conducting the memory cells M, which is insufficient for generating a write operation, is also applied to the control gate (nonselective word lines (second nonselective word lines) except for the first nonselective word lines) of nonselective memory cells M0 to Mn−2, Mn+2 to M63, DMS, and DMD (second nonselective memory cells) other than the first nonselective memory cells Mn−1 and Mn+1. However, the write pass voltage Vpass1 is a value greater than the write pass voltage Vpass2 (Vpass1>Vpass2). As an example, the former is 10 V, and the latter is 8 V.

In addition, a power supply voltage Vdd is applied to the selective gate line SGD that is connected to the selective transistor S2, and a ground potential Vss is applied to the selective gate line SGS that is connected to the selective transistor S1.

Next, in the case of a write operation for changing the threshold voltage of the selective memory cells Mn in a forward direction, the ground potential Vss is applied to the corresponding bit lines BL. Therefore, the threshold voltage of the selective memory cells Mn is changed in a forward direction by a potential difference between the ground potential Vss applied to channels of the memory string via the selective transistor S2 from the bit lines BL and the program voltage Vpgm.

On the other hand, in the case when the write into the selective memory cells Mn is prohibited, the power supply voltage Vdd is applied to the bit lines BL. Therefore, the selective transistor S2 is set to a nonconductive state, so that the channels of the selective memory cells Mn are set to a floating state. Thereby, even if the program voltage Vpgm is applied to the selective word lines WLn, since the potential is raised in the channels of the selective memory cells Mn by capacitance coupling, no write operation is carried out.

The reason why the write pass voltage Vpass2 lower than the write pass voltage Vpass1 is applied to the nonselective word lines WLn+1 and WLn−1 adjacent to the selective word lines WLn is that the interference between the cells due to the advance of miniaturization is suppressed. In other words, a further rise of the selective word lines WLn beyond the write voltage Vpgm due to coupling of the interference between the cells is prevented, thus being able to prevent an over-program in which the threshold voltage of the selective memory cells Mn is raised more than it is necessary.

Next, the case where the memory cell M0 or M63 is selected as a selective memory cell Ms (the case where the first nonselective word lines are word lines at the ends of the memory string) will be explained with reference to FIG. 6B. In FIG. 6B, the case where the memory cell M63 is selected will be explained. Voltages, which are applied to the bit lines BL, source line SL, and selective gate lines SGS and SGD, are similar to those of the case of FIG. 6A. In addition, a voltage Vpass2' (a first level of the first pass voltage) is applied to the control gate of the first nonselective memory cells ML62 and DMD adjacent to the selective memory cell M63. On the other hand, the write pass voltage Vpass1 is applied to the control gate of the second nonselective memory cells (DMS, M0 to M61). The write pass voltage Vpass2' is higher than the write pass voltage Vpass2 (a second level of the first pass voltage). As an example, in case Vpass2 is about 8 V, Vpass2' is set to about 9.5 V higher than the voltage.

Figure 6B:
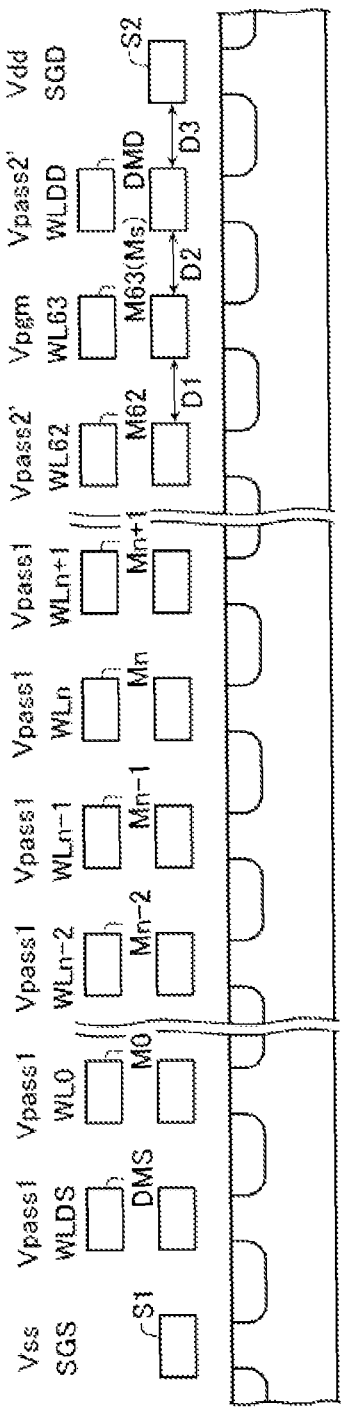
FIG. 6B is an illustrative diagram showing the write operation according to the first embodiment.

Here, in FIG. 6B, the case where the memory cell M63 is the selective memory cell Ms has been shown; however, the voltages can also be approximately similarly applied to the case where the memory cell M0 is the selective memory cell Ms. In other words, the write pass voltage Vpass2' is applied to the control gate of the first nonselective memory cells M1 and DMS, and the write pass voltage Vpass1 is applied to the control gate of the second nonselective memory cells (M2 to M63, DMD).

In other words, in this embodiment, in case the memory cells (including the dummy cells) at the utmost ends in the NAND cell units NU are the first nonselective memory cells, the write pass voltage Vpass2' is applied to their control gate. The write pass voltage Vpass2' is higher than the ordinary write pass voltage Vpass2 (Vpass2'>Vpass2). In case the selective memory cell Ms is near the end of the NAND cell unit NU, the influence from its adjacent memory cells (the interference between the cells) is small in many cases, compared with the case where the selective memory cells Ms is in the vicinity of the center of the NAND cell unit NU. As mentioned above, the value of the write pass voltage Vpass2' is made different from the ordinary Vpass2, all the memory cells of the NAND cell unit NU may receive a write operation under an equal condition. Therefore, the probability of wrong write occurrence can be suppressed.

Here, in the first embodiment, in case the distance between the gates of the memory cell M62 and the memory cell M63 is D1, the distance between the gates of the memory cell M63 and the dummy cell DMD is D2, and the distance between the gates of the dummy cell DMD and the drain side selective transistor S2 is D3, the relationship of D3>D1>D2 is preferable. In case the memory cell M63 is the selective memory cell Ms, the write pass voltage Vpass2' higher than an ordinary voltage is applied to the dummy cell DMD. In this case, to suppress the occurrence of a GIDL current (Gate Induced Drain Leakage current) in the drain side selective transistor S2, it is preferable to increase the distance D3. On the contrary, since the voltage difference between the write pass voltage Vpass2' and the program voltage Vpgm is small, even if the distance D2 is shorter than other distances, there will be no problem. It is preferable for the distances D1 to D3 to have a difference of 20% or more, respectively.

Here, it is also preferable for the distance D1' between the gates of the memory cell M1 and the memory cell M0, the distance D2' between the gates of the memory cell M0 and the dummy cell DMS, and the distance D3' between the gates of the dummy cell DMS and the source side selective transistor S1 to have a similar relationship.

Second Embodiment

Figure 7C:
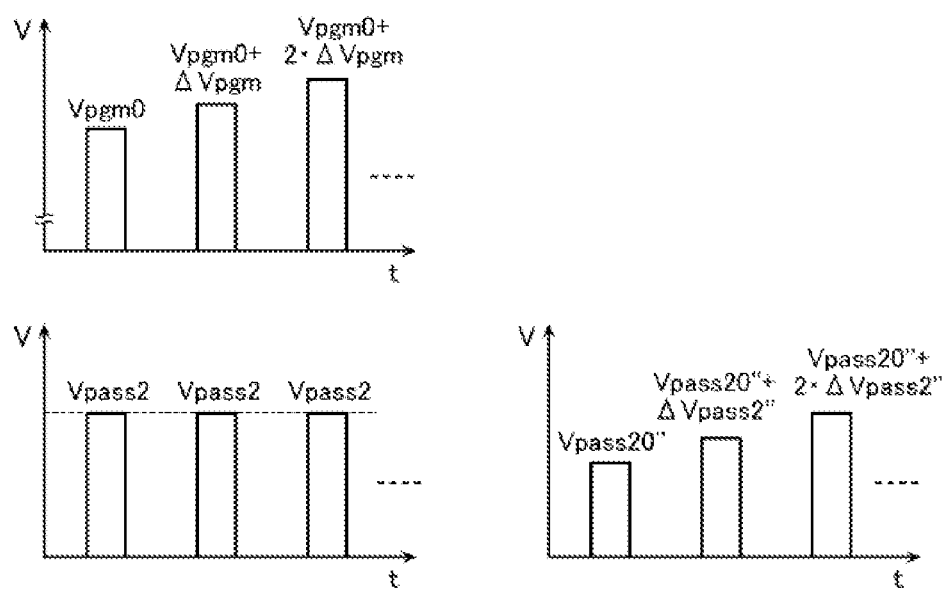
FIG. 7C is an illustrative diagram showing the write operation according to the second embodiment.

Next, a nonvolatile semiconductor memory device of a second embodiment will be explained with reference to FIG. 7A, FIG. 7B, and FIG. 7C. The constitution of the device is similar to that of the first embodiment. However, the operation at a time of a write operation in this embodiment is different from that of the first embodiment.

First, the case where memory cells other than the memory cells M0 and M63 are selected as the selective memory cells Ms will be explained with reference to FIG. 7A. In this case, the voltage applying method is similar to that of the first embodiment (FIG. 6A). In other words, the write pass voltage Vpass2 is applied to the control gate of the first nonselective memory cells Mn−1 and Mn+1. In addition, the write pass voltage Vpass1 is applied to the control gate of the second nonselective memory cells (Vpass1>Vpass2).

Next, the case where the memory cell M0 or M63 is selected as the selective memory cell Ms will be explained with reference to FIG. 7B. In FIG. 7B, the case where the memory M63 is selected will be explained.

Voltages, which are applied to the bit lines BL, the source line SL and the selective gate lines SGS and SGD, are similar to those of the case of FIG. 7A. In addition, the write pass voltage Vpass2" is applied to the control gate of the first nonselective memory cells M62 and DMD adjacent to the selective memory cell M63. Moreover, the write pass voltage Vpass1 is applied to the control gate of the second nonselective memory cells (DMS, M0 to M61). The write pass voltage Vpass2" is a value smaller than the write pass voltage Vpass1.

Furthermore, the write pass voltage Vpass2" is a value smaller than the ordinary write pass voltage Vpass2 (Vpass2"<Vpass2). From such a viewpoint, the size relation is opposite to that of the first embodiment.

However, the write pass voltage Vpass2" is set to an initial value Vpass20" at a time of an initial write operation.

After the write operation, a write verifying operation for verifying whether or not the write into a desire threshold voltage has been completed is implemented. As a result of the write verifying operation, if it is determined that the write operation has not been completed, the write operation is implemented again. In this case, as shown in FIG. 7C, the program voltage Vpgm is also set to a voltage Vpgm0+ ΔVpgm increased from an initial value Vpgm0 by a step-up voltage ΔVpgm (step-up operation). After the implementation of the write operation of the stepped-up program voltage Vpgm (Vpgm0+ΔVpgm), the write verifying operation is implemented again. Next, the step-up operation, the write operation, and the write verifying operation are repeated until the write completion is detected.

Therefore, in case the step-up operation is applied to the program Vpgm, a step-up operation is also applied to the write pass voltage Vpass2". In other words, in case the program voltage Vpgm is set to Vpgm0+k·ΔVpgm (k represents a natural number) by the step-up operation, the write pass voltage Vpass2" is also set to Vpass20"+k·ΔVpass2" by the step-up operation.

Therefore, the write pass voltage Vpass2" is stepped up in accordance with the program voltage Vpgm in order to prevent that the potential difference between the program voltage Vpgm and the write pass voltage Vpass2" is too large, causing a write error. On the other hand, in case memory cells other than the memory cells M0 and M63 are selected, the write pass voltage Vpass2, which is applied to the control gate of the first nonselective memory cells, is maintained at a fixed value, regardless of the step-up operation of the program voltage Vpgm. The reason for this is that since the write pass voltage Vpass2 has a large value from the start, the potential difference between the write pass voltage Vpass2 and the program voltage Vpgm will not be a meaningful value, even if the step-up operation is not applied.

Here, in the second embodiment, in case the distance between the gates of the memory cell M62 and the memory cell M63 is D1, the distance between the gates of the memory cell M63 and the dummy cell DMD is D2, and the distance between the gates of the dummy cell DMD and the drain side selective transistor S2 is D3, the relationship of D2>D1>D3 is preferable. In case the memory cell M63 is the selective memory cell Ms, the write pass voltage Vpass2" lower than an ordinary voltage is applied to the dummy cell DMD. For this reason, the GIDL current (Gate Induced Drain Leakage current) is less likely to be generated in the drain side selective transistor S2. Therefore, the distance D3 can be set to a relatively small value.

Here, it is also preferable for the distance D1' between the gates of the memory cell M1 and the memory cell M0, the distance D2' between the gates of the memory cell M0 and the dummy cell DMS, and the distance D3' between the gates of the dummy cell DMS and the source side selective transistor S1 to have a similar relationship.

Third Embodiment

Next, a nonvolatile semiconductor memory device of a third embodiment will be explained with reference to FIG. 8A, FIG. 8B, and FIG. 8C. The constitution of the device is similar to that of the first and second embodiments. However, the operation at a time of a write operation in this embodiment is different from those of the aforementioned embodiments.

First, the case where memory cells other than the memory cells M0 and M63 are selected as the selective memory cells Ms will be explained with reference to FIG. 8A. In this case, the voltage applying method is similar to that of the first embodiment (FIG. 6A). In other words, the write pass voltage Vpass2 is applied to the control gate of the first nonselective memory cells Mn−1 and Mn+1. In addition, the write pass voltage Vpass1 is applied to the control gate of the second nonselective memory cells (Vpass1>Vpass2).

Next, the case where the memory cell M0 or M63 is selected as the selective memory cell Ms will be explained with reference to FIG. 8B. In FIG. 8B, the case where the memory M63 is selected is explained; however, the case where the memory cell M0 is selected is also similar.

Voltages, which are applied to the bit lines BL, the source line SL and the selective gate lines SGS and SGD, are similar to those of the case of FIG. 8A. In addition, the write pass voltage Vpass2' is applied to the control gate of the first nonselective memory cells M62 and DMD adjacent to the selective memory cell M63. Moreover, the write pass voltage Vpass1 is applied to the control gate of the second nonselective memory cells (DMS, M0 to M62). The write pass voltage Vpass1 is higher than the write pass voltage Vpass2'. Furthermore, the write pass voltage Vpass2' is a value greater than the ordinary write pass voltage Vpass2 (Vpass2'>Vpass2). From this point of view, the size relation is the same as that of the first embodiment.

Figure 8C:
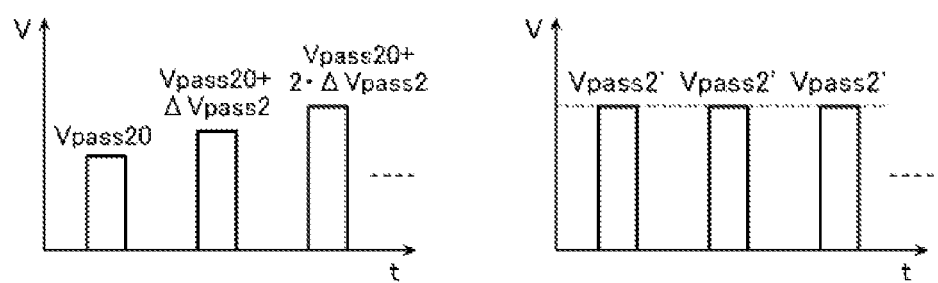
FIG. 8C is an illustrative diagram showing the write operation according to the third embodiment.

In addition, the write pass voltage Vpass2', as shown in FIG. 8C, is a fixed value Vpass20", regardless of the step-up operation of the program voltage Vpgm.

On the other hand, in case the program voltage Vpgm is set to Vpgm+k·ΔVpgm (k represents a natural number) by the step-up operation, the write pass voltage Vpass2 is stepped up to Vpass20+k·ΔVpass2 as shown in FIG. 8C.

Fourth Embodiment

Next, a nonvolatile semiconductor memory device of a fourth embodiment will be explained with reference to FIGS. 9A and 9B. The constitution of the device is similar to that of the aforementioned embodiments. However, the operation at a time of a write operation in this embodiment is different from those of the aforementioned embodiments.

In this embodiment, in case the memory cells at the ends of the NAND memory unit NU are the first nonselective memory cells, the size of a write pass voltage, which is applied to their control gate, is determined in accordance with the implementation times (write/erase times $N_{WE}$) of a write operation or erase operation. As an example, in this embodiment, the value of the write pass voltage is switched using $N_{WE}$=1000 as the delimitation value. When $N_{WE}$≥1000, an operation similar to that of the first embodiment is carried out. In other words, in case the memory cell M0 or M63 is the selective memory cell Ms, the write pass voltage Vpass2' higher than the ordinary write pass voltage Vpass2 is applied to the first nonselective memory cells, and the write pass voltage Vpass1 is applied to the second nonselective memory cells.

On the other hand, when $N_{WE}$<1000, unlike the first embodiment, even in case the memory cell M0 or M63 is the selective memory cell Ms, the ordinary write voltage Vpass2 is applied to the first nonselective memory cells (the write pass voltage Vpass1 is applied to the second nonselective memory cells).

Therefore, in the fourth embodiment, in case the first nonselective memory cells are memory cells at the ends of the memory string, voltages, which are applied to their control gate, are switched by the size of the write/erase times $N_{WE}$. Therefore, if the write/erase times $N_{WE}$ increases, the gate insulating film of the memory cells tends to be degraded. An operation similar to that of the first embodiment is implemented only at the degradation timing of the gate insulating film, so the life of the memory cells can be extended.

FIGS. 10A and 10B show an example in which a write method is changed in accordance with the write/erase times $N_{WE}$ in the case where the voltage applying method of the second embodiment is adopted.

While certain embodiments have been described, these embodiments have been presented by way of example only, and are not intended to limit the scope of the invention. Indeed, the novel embodiment described herein may be embodied in a variety of other forms; furthermore, various omissions, substitutions and changes in the form of the embodiment described herein may be made without departing from the spirit of the invention. The accompanying acclaims and their equivalents are intended to cover such forms or modifications as would fall within the scope and spirit of the invention. For example, in the aforementioned embodiments, the case where the memory cells at the ends of the memory string are defined as the dummy cells and the dummy cells are not used for data storage has been explained. However, the present embodiment can also be applied to a nonvolatile semiconductor memory device in which one NAND memory unit NU has only the memory cells M0 to M63 and the selective transistors S1 and S2 and does not have dummy cells. In this case, in case the memory cell M0 or M63 is the first nonselective memory cell, the voltage applying method of the aforementioned embodiments can be employed.

Figure 11:
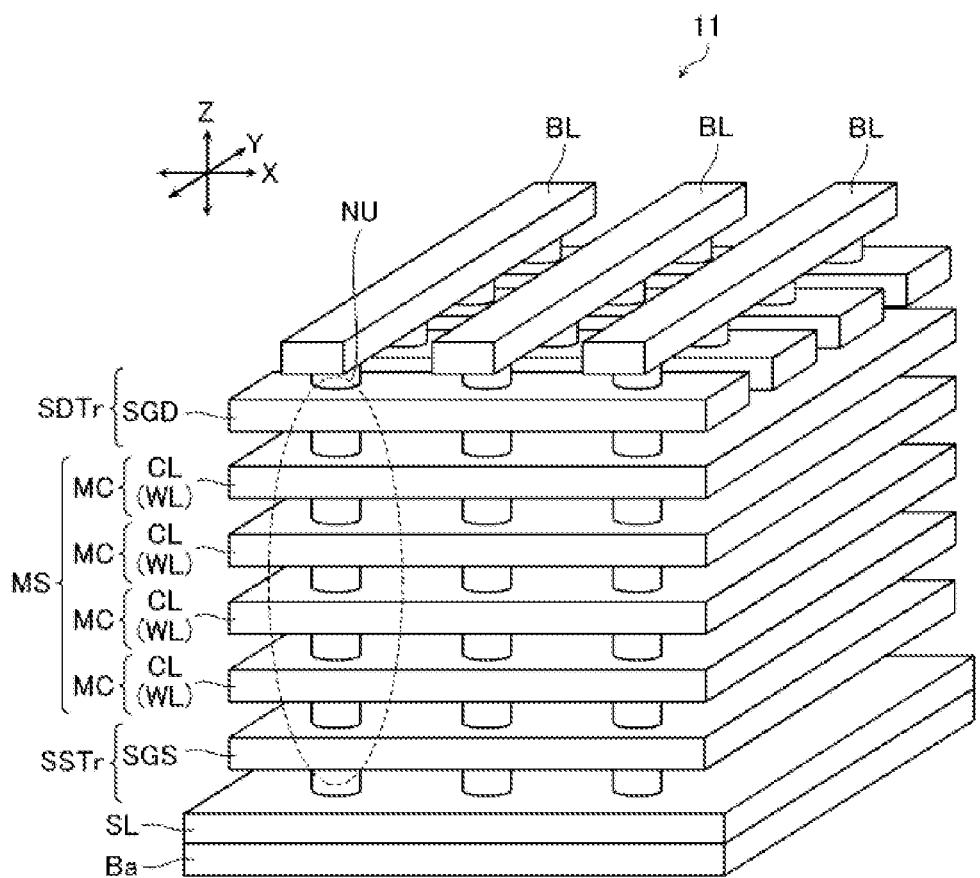
FIG. 11 depicts a modified example in which embodiments may be implemented.

In addition, in the aforementioned embodiments, explanation has been made for examples of the memory array 11 having a two-dimensional structure; however, the memory array may also have a three-dimensional structure. For example, the memory cell 11 having a three-dimensional structure, as shown in FIG. 11, has semiconductor layers SC and conductive layers CL. The semiconductor layers SC extend in the direction (Z direction) perpendicular to a semiconductor substrate Ba and function as bodies of memory cells MC. The conductive layers CL enclose the side surfaces of the semiconductor layers SC via a charge storage layer. The conductive layers CL function as gate and word lines WL of the memory cells MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array including a plurality of memory cells connected in series to form a memory string;
   a plurality of word lines, each word line connected to a control gate of a respective memory cell in the memory string; and
   a control circuit configured to control a data write to the memory cell array, wherein
   the control circuit applies:
     a program voltage to a selected word line,
     a first write pass voltage, which is lower than the program voltage, to a first group of non-selected word lines, the first group comprising word lines adjacent to the selected word line, and
     a second write pass voltage, which is higher than the first write pass voltage, to a second group of non-selected word lines, the second group not including the first group; and
   the control circuit sets the first write pass voltage to a first level when the selected word line is connected to a memory cell at an end of the memory string and to a second level when the selected word line is not connected to a memory cell at either end of the memory string, the first level not equal to the second level.

2. The nonvolatile semiconductor memory device according to claim 1, wherein the first level of the first write pass voltage is higher than the second level of the first write pass voltage.

3. The nonvolatile semiconductor memory device according to claim 1, wherein the first level of the first write pass voltage is lower than the second level of the first write pass voltage.

4. The nonvolatile semiconductor memory device according to claim 1, wherein the control circuit increases the first level or the second level of the first write pass voltage in response to a result of a write verifying operation.

5. The nonvolatile semiconductor memory device according to claim 2, wherein the control circuit increases the second level of the first write pass voltage in response to a result of a write verifying operation.

6. The nonvolatile semiconductor memory device according to claim 5, wherein the control circuit maintains the first level of the first write pass voltage in response to the result of the write verifying operation.

7. The nonvolatile semiconductor memory device according to claim 3, wherein the control circuit increases the first level of the first write pass voltage in response to a result of a write verifying operation.

8. The nonvolatile semiconductor memory device according to claim 7, wherein the control circuit maintains the second level of the first write pass voltage in response to the result of the write verifying operation.

9. The nonvolatile semiconductor memory device according to claim 1, wherein the control circuit sets the first or the second level of the first write pass voltage based on an implementation time of a write operation or an erase operation.

10. The nonvolatile semiconductor memory device according to claim 2, further comprising:
    a first dummy memory cell connected to one end of the memory string;
    a first selective transistor connected to the first dummy memory cell;
   wherein control gates of the memory cells between the ends of the memory string are spaced at a first distance from each adjacent memory cell, a control gate of the first dummy memory cell is spaced at second distance from the control gate of the memory cell to which said dummy memory cell is connected, and the control gate of the first dummy memory cell is spaced at a third distance from a control gate of the first selective transistor, the third distance is greater than the first distance, and the first distance is greater than the second distance.

11. The nonvolatile semiconductor memory device according to claim 10, wherein the first distance is at least twenty percent greater than the second distance, and the third distance is at least twenty percent greater than first distance.

12. The nonvolatile semiconductor memory device according to claim 3, further comprising:
    a first dummy memory cell connected to one end of the memory string;

a first selective transistor connected to the first dummy memory cell;

wherein control gates of the memory cells between the ends of the memory string are spaced at a first distance from each adjacent memory cell, a control gate of the first dummy memory cell is spaced at second distance from the control gate of the memory cell to which said dummy memory cell is connected, and the control gate of the first dummy memory cell is spaced at a third distance from a control gate of the first selective transistor, the second distance is greater than the first distance, and the first distance is greater than the third distance.

13. A nonvolatile semiconductor memory device, comprising:
    a memory cell array including a plurality of memory cells connected in series to form a memory string;
    a plurality of word lines, each word line connected to a control gate of a respective memory cell in the memory string;
    a first dummy memory cell connected to a first end of the memory string;
    a second dummy memory cell connected to a second end of the memory string; and
    a control circuit configured to control a data write to the memory cell array, wherein the control circuit applies:
        a program voltage to a selected word line,
        a first write pass voltage, which is lower than the program voltage, to a first group of non-selected word lines, the first group comprising word lines adjacent to the selected word line, and
        a second write pass voltage, which is higher than the first write pass voltage, to a second group of non-selected word lines, the second group not including the first group; and
    the control circuit sets the first write pass voltage to a first level when the selected word line is connected to a memory cell at an end of the memory string and to a second level when the selected word line is not connected to a memory cell at either end of the memory string, the first level not equal to the second level.

14. The nonvolatile semiconductor memory device according to claim 13, further comprising:
    a first dummy memory cell word line connected to a control gate of the first dummy memory cell;
    a second dummy memory cell word line connected to a control gate of the second dummy memory cell;
    a first selective transistor connected to the first dummy memory cell; and
    a second selective transistor connected to the second dummy memory cell wherein the first write pass voltage is applied to the first dummy memory cell word line when the selected word line is connected to the memory cell on the first end of the memory string.

15. The nonvolatile semiconductor memory device according to claim 14, wherein the first level of the first write pass voltage is higher than the second level of the first write pass voltage.

16. The nonvolatile semiconductor memory device according to claim 14, wherein the first level of the first write pass voltage is lower than the second level of the first write pass voltage.

17. The nonvolatile semiconductor memory device according to claim 15, wherein the control circuit increases the second level of the first write pass voltage in response to a result of a write verifying operation.

18. The nonvolatile semiconductor memory device according to claim 17, wherein the control circuit maintains the first level of the first write pass voltage in response to the result of the write verifying operation.

19. The nonvolatile semiconductor memory device according to claim 16, wherein the control circuit increases the first level of the first write pass voltage in response to a result of a write verifying operation.

20. A method of controlling a data write to a memory cell array including a plurality of memory cells connected in series to form a memory string, and a plurality of word lines, each word line connected to a control gate of a respective memory cell in the memory string, the method comprising:
    selecting a word line connected to the control gate of a memory cell in the memory string;
    applying a program voltage to the selected word line;
    applying a first pass voltage to word lines adjacent to the selected word line; and
    applying a second pass voltage to the word lines not adjacent to the selected word line, wherein
    the first pass voltage is different from the second pass voltage, and both the first and the second pass voltages are less than the program voltage,
    when the selected word line is connected to a memory cell at the end of the memory string, setting the first pass voltage to a first level; and
    when the selected word line is not connected to a memory cell at the end of the memory string, setting the first pass voltage to a second level, the first level not equal to the second level.

* * * * *